United States Patent
Fenwick et al.

(10) Patent No.: US 11,008,653 B2
(45) Date of Patent: *May 18, 2021

(54) MULTI-LAYER COATING WITH DIFFUSION BARRIER LAYER AND EROSION RESISTANT LAYER

(71) Applicant: Applied Materials, Inc., Santa Clara, CA (US)

(72) Inventors: David Fenwick, Los Altos Hills, CA (US); Xiaowei Wu, San Jose, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

This patent is subject to a terminal disclaimer.

(21) Appl. No.: 15/844,335

(22) Filed: Dec. 15, 2017

(65) Prior Publication Data
US 2018/0112311 A1    Apr. 26, 2018

Related U.S. Application Data

(63) Continuation of application No. 15/646,602, filed on Jul. 11, 2017.
(Continued)

(51) Int. Cl.
*B32B 18/00* (2006.01)
*C23C 16/455* (2006.01)
(Continued)

(52) U.S. Cl.
CPC .... *C23C 16/45525* (2013.01); *C23C 14/0641* (2013.01); *C23C 14/08* (2013.01);
(Continued)

(58) Field of Classification Search
CPC . C23C 16/45525; C23C 16/405; C23C 16/40; C23C 16/34; C23C 14/08; C23C 14/0641
See application file for complete search history.

(56) References Cited

U.S. PATENT DOCUMENTS

| 4,724,169 A | 2/1988 | Keem et al. |
| 4,935,073 A | 6/1990 | Bartlett et al. |

(Continued)

FOREIGN PATENT DOCUMENTS

| CN | 101101887 A | 1/2008 |
| CN | 105088141 A | 11/2015 |

(Continued)

OTHER PUBLICATIONS

Rowland, J.C. "Atomic Layer Depositions of the Al2O3-Y2O3 Pseudo-Binary System", Doctoral Disertation, University of Florida, ProQuest LLC, 2010, pp. 1-106.
(Continued)

*Primary Examiner* — Laura A Auer
(74) *Attorney, Agent, or Firm* — Lowenstein Sandler LLP

(57) ABSTRACT

A multi-layer coating for a surface of an article comprises a diffusion barrier layer and an erosion resistant layer. The diffusion barrier layer may be a nitride film including but not limited to $TiN_x$, $TaN_x$, $Zr_3N_4$, and $TiZr_xN_y$. The erosion resistant layer may be a rare oxide film comprising $YZr_xO_y$. The diffusion barrier layer and the erosion resistant layer may be deposited on the article's surface using a thin film deposition technique including but not limited to, ALD, PVD, and CVD.

17 Claims, 5 Drawing Sheets

Related U.S. Application Data

(60) Provisional application No. 62/362,936, filed on Jul. 15, 2016.

(51) Int. Cl.

| | | |
|---|---|---|
| *C23C 16/40* | (2006.01) | |
| *C23C 14/06* | (2006.01) | |
| *C23C 14/08* | (2006.01) | |
| *C23C 16/34* | (2006.01) | |

(52) U.S. Cl.
 CPC .............. *C23C 16/34* (2013.01); *C23C 16/40* (2013.01); *C23C 16/405* (2013.01)

(56) References Cited

U.S. PATENT DOCUMENTS

| | | |
|---|---|---|
| 5,613,442 A | 3/1997 | Ahola et al. |
| 5,630,314 A | 5/1997 | Kojima et al. |
| 5,805,973 A | 9/1998 | Coffinberry et al. |
| 5,840,434 A | 11/1998 | Kojima et al. |
| 6,139,983 A | 10/2000 | Ohashi et al. |
| 6,352,620 B2 | 3/2002 | Yu et al. |
| 6,548,424 B2 | 4/2003 | Putkonen |
| 6,613,442 B2 | 9/2003 | O'Donnell et al. |
| 6,632,549 B1 | 10/2003 | Ohashi et al. |
| 6,641,941 B2 | 11/2003 | Yamada et al. |
| 6,685,991 B2 | 2/2004 | Wataya et al. |
| 6,773,751 B2 | 8/2004 | O'Donnell et al. |
| 6,777,353 B2 | 8/2004 | Putkonen |
| 6,830,622 B2 | 12/2004 | O'Donnell et al. |
| 6,858,332 B2 | 2/2005 | Yamada |
| 6,858,546 B2 | 2/2005 | Niinisto et al. |
| 6,916,534 B2 | 7/2005 | Wataya et al. |
| 7,138,192 B2 | 11/2006 | Yamada et al. |
| 7,282,254 B1 | 10/2007 | Cho et al. |
| 7,351,658 B2 | 4/2008 | Putkonen |
| 7,384,696 B2 | 6/2008 | Hayasaki et al. |
| 7,498,272 B2 | 3/2009 | Niinisto et al. |
| 7,560,376 B2 | 7/2009 | Escher et al. |
| 7,569,280 B2 | 8/2009 | Hayasaki et al. |
| 7,696,117 B2 | 4/2010 | Sun et al. |
| 7,754,621 B2 | 7/2010 | Putkonen |
| 7,780,786 B2 | 8/2010 | Mitsuhashi et al. |
| 7,968,205 B2 | 6/2011 | Nakano et al. |
| 7,998,883 B2 | 8/2011 | Putkonen |
| 8,114,525 B2 | 2/2012 | Han et al. |
| 8,399,862 B2 | 3/2013 | Ohmi et al. |
| 8,619,406 B2 | 12/2013 | Cho et al. |
| 8,858,745 B2 | 10/2014 | Sun et al. |
| 8,916,021 B2 | 12/2014 | Sun et al. |
| 9,012,030 B2 | 4/2015 | Han et al. |
| 9,090,046 B2 | 7/2015 | Sun et al. |
| 9,343,289 B2 | 5/2016 | Sun et al. |
| 9,394,615 B2 | 7/2016 | Sun et al. |
| 9,440,886 B2 | 9/2016 | Sun et al. |
| 9,460,898 B2 | 10/2016 | Kim et al. |
| 9,551,070 B2 | 1/2017 | Chang et al. |
| 9,583,369 B2 | 2/2017 | Sun et al. |
| 9,617,188 B2 | 4/2017 | Sun et al. |
| 9,617,633 B2 | 4/2017 | He et al. |
| 9,633,884 B2 | 4/2017 | He et al. |
| 9,666,466 B2 | 5/2017 | Parkhe et al. |
| 2002/0177001 A1 | 11/2002 | Harada et al. |
| 2003/0029563 A1 | 2/2003 | Kaushal et al. |
| 2003/0051811 A1 | 3/2003 | Uchimaru |
| 2004/0023811 A1 | 2/2004 | Iijima |
| 2005/0064248 A1 | 3/2005 | O'Donnell et al. |
| 2005/0227118 A1 | 10/2005 | Uchimaru et al. |
| 2006/0037536 A1 | 2/2006 | Kobayashi et al. |
| 2006/0073354 A1 | 4/2006 | Watanabe et al. |
| 2008/0016684 A1 | 1/2008 | Olechnowicz et al. |
| 2008/0029032 A1 | 2/2008 | Sun et al. |
| 2008/0066647 A1 | 3/2008 | Harada et al. |
| 2008/0069966 A1 | 3/2008 | Otsuki |
| 2008/0213496 A1 | 9/2008 | Sun et al. |
| 2008/0264565 A1 | 10/2008 | Sun et al. |
| 2009/0029108 A1 | 1/2009 | Barth et al. |
| 2009/0046825 A1 | 2/2009 | Dulka et al. |
| 2009/0194233 A1 | 8/2009 | Tamura et al. |
| 2009/0214825 A1 | 8/2009 | Sun et al. |
| 2010/0104403 A1 | 4/2010 | Cho et al. |
| 2010/0119843 A1 | 5/2010 | Sun et al. |
| 2010/0119844 A1 | 5/2010 | Sun et al. |
| 2010/0129670 A1 | 5/2010 | Sun et al. |
| 2010/0323124 A1 | 12/2010 | Vartabedian et al. |
| 2011/0091700 A1 | 4/2011 | Simpson |
| 2012/0024449 A1 | 2/2012 | Ricci et al. |
| 2012/0135155 A1 | 5/2012 | Han et al. |
| 2012/0138472 A1 | 6/2012 | Han et al. |
| 2012/0183790 A1 | 7/2012 | Petorak et al. |
| 2013/0154059 A1 | 6/2013 | Ohmi et al. |
| 2013/0288037 A1 | 10/2013 | Sun et al. |
| 2014/0116338 A1 | 5/2014 | He et al. |
| 2014/0120312 A1 | 5/2014 | He et al. |
| 2014/0272341 A1 | 9/2014 | Duan et al. |
| 2014/0334060 A1 | 11/2014 | Parkhe et al. |
| 2014/0377504 A1 | 12/2014 | Sun et al. |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0061237 A1 | 3/2015 | Sun et al. |
| 2015/0064450 A1 | 3/2015 | Sun et al. |
| 2015/0079370 A1 | 3/2015 | Sun et al. |
| 2015/0152540 A1 | 6/2015 | Sato et al. |
| 2015/0158775 A1 | 6/2015 | Sun et al. |
| 2015/0218057 A1 | 8/2015 | Duan et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |
| 2015/0376760 A1 | 12/2015 | Naim et al. |
| 2016/0079040 A1 | 3/2016 | Park et al. |
| 2016/0181627 A1 | 6/2016 | Roeder et al. |
| 2016/0211121 A1 | 7/2016 | Sun et al. |
| 2016/0240726 A1 | 8/2016 | He et al. |
| 2016/0273095 A1 | 9/2016 | Lin et al. |
| 2016/0312351 A1 | 10/2016 | Liu et al. |
| 2016/0326625 A1 | 11/2016 | Sun et al. |
| 2016/0326626 A1 | 11/2016 | Sun et al. |
| 2016/0333471 A1 | 11/2016 | Lee et al. |
| 2016/0336210 A1 | 11/2016 | Cooke et al. |
| 2016/0358749 A1 | 12/2016 | Sant |
| 2016/0362795 A1 | 12/2016 | Lee et al. |
| 2016/0375515 A1 | 12/2016 | Xu et al. |
| 2016/0379806 A1 | 12/2016 | Xu et al. |
| 2017/0022595 A1 | 1/2017 | Sato et al. |
| 2017/0110293 A1 | 4/2017 | Sun et al. |
| 2017/0130319 A1 | 5/2017 | Sun et al. |
| 2017/0140969 A1 | 5/2017 | Kuo et al. |
| 2018/0044800 A1 | 2/2018 | Hendrix et al. |

FOREIGN PATENT DOCUMENTS

| | | |
|---|---|---|
| CN | 106544622 | 3/2017 |
| EP | 1548153 A2 | 6/2005 |
| EP | 3522312 A2 | 8/2019 |
| JP | H7126827 | 5/1995 |
| JP | 2000313656 | 11/2000 |
| KR | 100859672 B1 | 9/2008 |
| KR | 20090020031 A | 2/2009 |
| KR | 101249951 | 4/2013 |
| KR | 101661640 | 9/2016 |
| KR | 20160112434 A | 9/2016 |
| TW | 201329275 | 7/2013 |
| TW | 201408679 | 3/2014 |
| TW | 201523891 | 6/2015 |
| WO | 2009/008598 | 1/2009 |

(56) References Cited

FOREIGN PATENT DOCUMENTS

| WO | 2015120265 | 8/2015 |
|---|---|---|
| WO | 2016/021799 A1 | 2/2016 |

OTHER PUBLICATIONS

Johansson, P. et al., "Atomic Layer Deposition Process for Barrier Applications of Flexible Packaging," 2010 Place Conference, Apr. 18-21, 2010, 33 pages, Albequerque, New Mexico.

Putkonen, M. et al. "Low-Temperature ALE Deposition of Y2O3 Thin Films from β-Diketonate Precursors", Chemical Vapor Deposition, 2001, vol. 7, No. 1, pp. 44-50, Verlag GmbH, Weinheim, Germany.

Pilvi, T. et al. "ALD of YF3 Thin Films from TiF4 and Y(thd)3 Precursors", Chemical Vapor Deposition, 2009, vol. 15, pp. 27-32, Verlag GmbH & Co., Weinheim, Germany.

International Search Report and Written Opinion of International Patent Application No. PCT/US2017/042110 dated Oct. 24, 2017, 11 pages.

English Translation of Chinese Office Action for 201780002518.0 dated May 11, 2020, 15 pages.

English Translation of Chinese Office Action for 201810637499.5 dated May 18, 2020 13 pages.

Office Action and English Translation of Search Report for Taiwanese Patent Application No. 107101620 dated Jun. 19, 2020, 11 pages.

Search Report and Translation thereof for Taiwan Patent Application No. 106123559, dated Nov. 16, 2020 and mailed in an Office Action dated Nov. 27, 2020, 2 pages.

Search Report and Translation thereof for Taiwan Patent Application No. 107101620, dated Nov. 16, 2020 and mailed in an Office Action dated Nov. 27, 2020, 2 pages.

MULTI-LAYER COATING WITH DIFFUSION BARRIER LAYER AND EROSION RESISTANT LAYER

RELATED APPLICATIONS

This patent application is a continuation of U.S. patent application Ser. No. 15/646,602, filed Jul. 11, 2017, which claims the benefit under 35 U.S.C. § 119(e) of U.S. Provisional Application No. 62/362,936, filed Jul. 15, 2016, both of which are incorporated herein in their entirety.

TECHNICAL FIELD

Embodiments of the present disclosure relate to multi-layer coatings acting as a diffusion barrier and as an erosion resistant coating, a method for forming a multi-layer coating, and a process chamber component coated with a multi-layer coating.

BACKGROUND

Various manufacturing processes expose semiconductor process chamber components to high temperatures, high energy plasma, a mixture of corrosive gases, high stress, and combinations thereof. These extreme conditions may erode the chamber components, corrode the chamber components, lead to diffusion of chamber components' materials to the substrates, and increase the chamber components' susceptibility to defects. It is desirable to reduce these defects and improve the components' erosion, corrosion, and diffusion resistance in such extreme environments. Coating semiconductor process chamber components with protective coatings is an effective way to reduce defects and extend their durability.

SUMMARY

Some embodiments of the present invention cover a multi-layer coating. The multi-layer coating may comprise a diffusion barrier layer selected from a group consisting of $TiN_x$, $TaN_x$, $Zr_3N_4$, and $TiZr_xN_y$. The multi-layer coating may further comprise an erosion resistant layer selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$, and $YZr_xAl_yO_z$. The erosion resistant layer may cover the diffusion barrier layer.

In some embodiments, disclosed herein is a method for forming a multi-layer coating. The method includes depositing a diffusion barrier layer onto a surface of an article. The diffusion barrier layer may be deposited using a first deposition process selected from a group consisting of atomic layer deposition, physical vapor deposition, and chemical vapor deposition. The diffusion barrier layer may be selected from a group consisting of $TiN_x$, $TaN_x$, $Zr_3N_4$, and $TiZr_xN_y$. The method further includes depositing an erosion resistant layer onto the diffusion barrier layer. The erosion resistant layer may be deposited using a second deposition process selected from the group consisting of atomic layer deposition, physical vapor deposition, and chemical vapor deposition. The erosion resistant layer may be selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$, and $YZr_xAl_yO_z$.

In some embodiments, the present invention covers a coated process chamber component. The coated process chamber component may comprise a process chamber component having a surface and a multi-layer coating coated on the surface. In certain embodiments, the multi-layer coating may comprise a diffusion barrier layer selected from a group consisting of $TiN_x$, $TaN_x$, $Zr_3N_4$, and $TiZr_xN_y$. In certain embodiments, the multi-layer coating may further comprise an erosion resistant layer selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$, and $YZr_xAl_yO_z$. The erosion resistant layer may cover the diffusion barrier layer.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments are described herein with reference to a multi-layer coating that includes a nitride layer acting as a diffusion barrier layer and a rare earth oxide or fluoride layer acting as a corrosion and/or erosion resistant layer. The layers may be deposited through thin film deposition techniques such as ALD, CVD, and PVD. The nitride layer may be formed from constituents such as TiN, TaN, and $Zr_3N_4$. The diffusion barrier layer may prevent diffusion of elements within a chamber component to a surface of a substrate during the substrate processing. In some embodiments, the diffusion barrier layer may prevent diffusion of metals, such as copper, within a chamber component to a substrate's surface during substrate processing. The diffusion barrier layer assists in preventing the chemical constituents of the chamber component from contaminating the substrate. The erosion or corrosion resistant layer may be a multi-component layer formed from constituents such as $Al_2O_3$, $Y_2O_3$, $ZrO_2$, $YF_3$, and $Er_2O_3$. The corrosion and/or erosion resistant layer may be deposited on the diffusion barrier layer to prevent erosion or corrosion of the diffusion barrier layer and the underlying chamber component in the corrosive gas or plasma environment present in the process chamber. The thin film deposition techniques assist in obtaining conformal coating of substantially uniform thickness of chamber components having simple as well as complex geometric shapes (with holes and large aspect ratios). The multi-layer stack having a bottom thin film diffusion barrier layer and a top thin film erosion or corrosion resistant layer may minimize both diffusion based contamination of processed wafers as well as shed particle based contamination of the processed wafers. The diffusion barrier layer may seal the underlying article that is coated from diffusion of contaminants (for example, metal contaminant such as copper), while the erosion or corrosion resistant layer may protect both the article and the diffusion layer from erosion and/or corrosion by process gases and/or a plasma environment.

Figure 1:
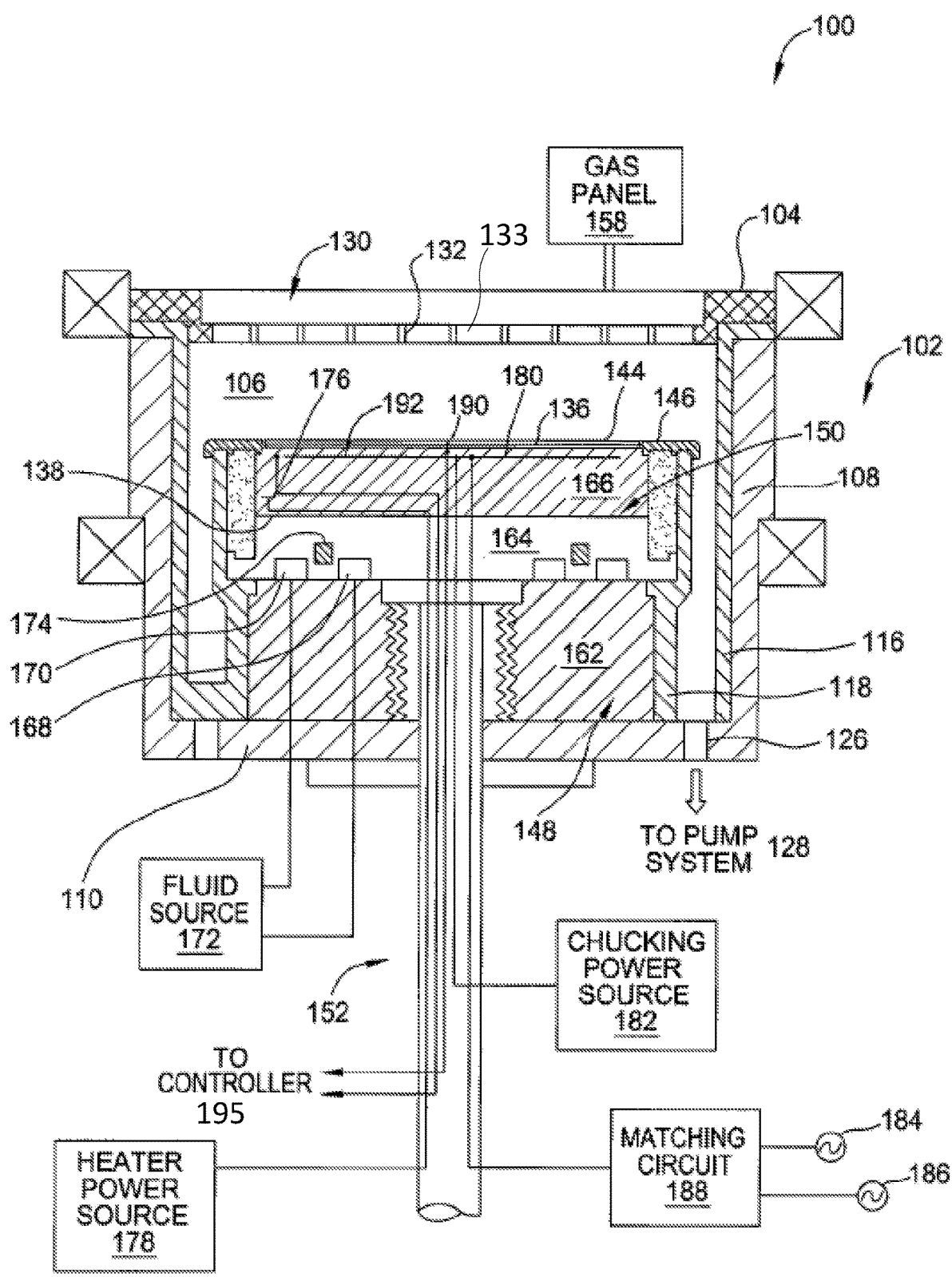
FIG. 1 depicts a sectional view of one embodiment of a processing chamber.

FIG. 1 is a sectional view of a semiconductor processing chamber 100 having one or more chamber components that are coated with a multi-layer coating in accordance with embodiments of the present invention. The processing chamber 100 may be used for processes in which a corrosive plasma environment having plasma processing conditions is provided. For example, the processing chamber 100 may be a chamber for a plasma etcher or plasma etch reactor, a plasma cleaner, and so forth. Examples of chamber components that may include a multi-layer coating include chamber components with complex shapes and holes having large aspect ratios. Some exemplary chamber components include a substrate support assembly 148, an electrostatic chuck (ESC) 150, a ring (e.g., a process kit ring or single ring), a chamber wall, a base, a gas distribution plate, a showerhead, gas lines, a nozzle, a lid, a liner, a liner kit, a shield, a plasma screen, a flow equalizer, a cooling base, a chamber viewport, a chamber lid, and so on. The multi-layer coating, which is described in greater detail below, is applied using an ALD process, a CVD process, a PVD process, or combinations thereof. ALD, CVD, and PVD which are described in greater detail with reference to FIGS. 2-4, allow for the application of a conformal thin film coating of relatively uniform thickness on all types of components including components with complex shapes and holes with large aspect ratios.

As illustrated, the substrate support assembly 148 has a multi-layer coating 136, in accordance with one embodiment. However, it should be understood that any of the other chamber components, such as showerheads, gas lines, electrostatic chucks, nozzles and others, may also be coated with a multi-layer coating.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-layer coating.

An outer liner 116 may be disposed adjacent the sidewalls 108 to protect the chamber body 102. The outer liner 116 may be fabricated and/or coated with a multi-layer coating.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 is used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum base or an anodized aluminum base. The GDP 133 may be made from Si or SiC, or may be a ceramic such as $Y_2O_3$, $Al_2O_3$, YAG, and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base 104, GDP 133 and/or nozzle may all be coated with a multi-layer coating according to an embodiment.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resistant material such as those discussed with reference to the outer liner 116. In one embodiment, the inner liner 118 may be fabricated from the same materials as those of outer liner 116. Additionally, the inner liner 118 may also be coated with a multi-layer coating.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. An upper surface of the electrostatic puck 166 may be covered by the multi-layer coating 136 in the illustrated embodiment. The multi-layer coating 136 may be disposed on the entire exposed surface of the electrostatic chuck 150 including the outer and side periphery of the thermally conductive base 164 and the electrostatic puck 166 as well as any other geometrically complex parts or holes having large aspect ratios in the electrostatic chuck.

The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164. The conduits and heater heat and/or cool the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. These surface features may all be coated with a multi-layer coating according to an embodiment. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2:
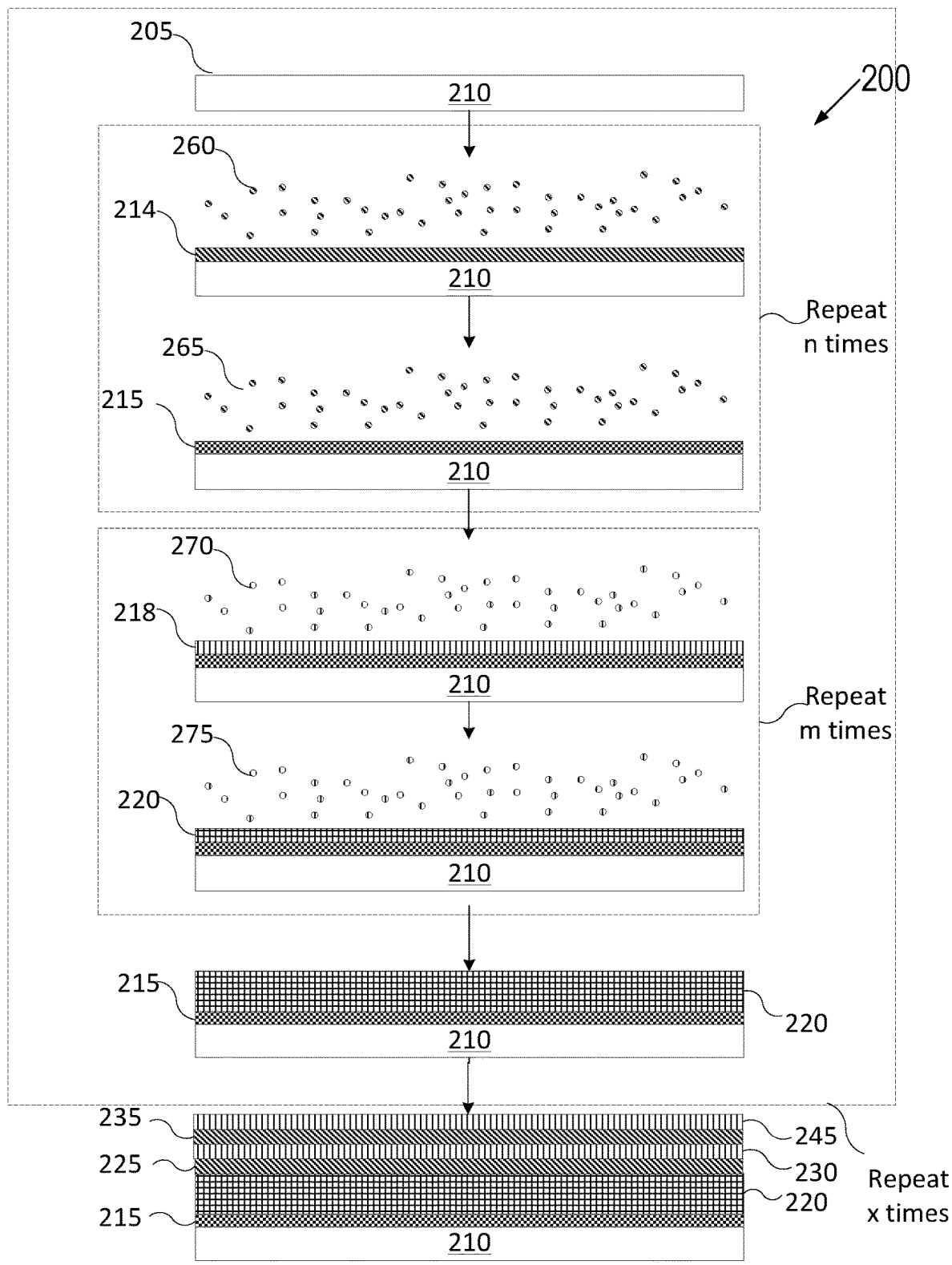
FIG. 2 depicts a deposition mechanism applicable to a variety of Atomic Layer Deposition (ALD) techniques, in accordance with embodiments of the present invention.

FIG. 2 depicts a deposition process in accordance with a variety of ALD techniques. Various types of ALD processes exist and the specific type may be selected based on several factors such as the surface to be coated, the coating material, chemical interaction between the surface and the coating material, etc. The general principle of an ALD process comprises growing or depositing a thin film layer by repeatedly exposing the surface to be coated to sequential alternating pulses of gaseous chemical precursors that chemically react with the surface one at a time in a self-limiting manner.

FIG. 2 illustrates an article 210 having a surface 205. Each individual chemical reaction between a precursor and the surface is known as a "half-reaction." During each half reaction, a precursor is pulsed onto the surface for a period of time sufficient to allow the precursor to fully react with the surface. The reaction is self-limiting as the precursor will react with a finite number of available reactive sites on the surface, forming a uniform continuous adsorption layer on the surface. Any sites that have already reacted with a precursor will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

In FIG. 2, article 210 having surface 205 may be introduced to a first precursor 260 for a first duration until a first half reaction of the first precursor 260 with surface 205 partially forms film layer 215 by forming an adsorption layer 214. Subsequently, article 210 may be introduced to a second precursor 265 (also referred to as a reactant) that reacts with the adsorption layer 214 to fully form the layer 215. The first precursor 260 may be a precursor for yttrium or another metal, for example. The second precursor 265 may be an oxygen precursor if the layer 215 is an oxide, a fluorine precursor if the layer 215 is a fluoride, or a nitrogen precursor if this layer is a nitride. The article 210 may alternately be exposed to the first precursor 260 and second precursor 265 up to n number of times to achieve a target thickness for the layer 215. N may be an integer from 1 to 100, for example. Film layer 215 may be uniform, continuous and conformal. The film layer 215 may also have a very low porosity of less than 1% in embodiments, less than 0.1% in some embodiments, or approximately 0% in further embodiments. Subsequently, article 210 having surface 205 and film layer 215 may be introduced to a third precursor 270 that reacts with layer 215 to partially form a second film layer 220 by forming a second adsorption layer 218. Subsequently, article 210 may be introduced to another precursor 275 (also referred to as a reactant) that reacts with adsorption layer 218 leading to a second half reaction to fully form the layer 220. The article 210 may alternately be exposed to the third precursor 270 and fourth precursor 275 up to m number of times to achieve a target thickness for the layer 220. M may be an integer from 1 to 100, for example. The second film layer 220 may be uniform, continuous and conformal. The second film layer 220 may also have a very low porosity of less than 1% in some embodiments, less than 0.1% in some embodiments, or approximately 0% in further embodiments. Thereafter, the sequence of introducing the article 210 to precursors 260 and 265 n number of times and then to precursors 270 and 275 m number of times may be repeated and performed x number of times. X may be an integer from 1 to 100, for example. A result of the sequence may be to grow additional layers 225, 230, 235, and 245. The number and thickness of the various layers may be independently selected based on the targeted coating thickness and properties. The various layers may remain intact (i.e. separate) or in some embodiments may be interdiffused.

The surface reactions (e.g., half-reactions) are done sequentially. Prior to introduction of a new precursor, the chamber in which the ALD process takes place may be purged with an inert carrier gas (such as nitrogen or air) to remove any unreacted precursors and/or surface-precursor reaction byproducts. At least two precursors are used. In some embodiments, more than two precursors may be used to grow film layers having the same composition (e.g., to grow multiple layers of $Y_2O_3$ on top of each other). In other embodiments, different precursors may be used to grow different film layers having different compositions.

ALD processes may be conducted at various temperatures. The optimal temperature range for a particular ALD process is referred to as the "ALD temperature window." Temperatures below the ALD temperature window may result in poor growth rates and non-ALD type deposition. Temperatures above the ALD temperature window may result in thermal decomposition of the article or rapid desorption of the precursor. The ALD temperature window may range from about 200° C. to about 400° C. In some embodiments, the ALD temperature window is between about 150° C. to about 350° C.

The ALD process allows for conformal film layers having uniform film thickness on articles and surfaces having complex geometric shapes, holes with large aspect ratios, and three-dimensional structures. Sufficient exposure time of the precursors to the surface enables the precursors to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets). A first set of layers 215, 220, 225, and 230 may together form a diffusion barrier layer selected from a group consisting of $TiN_x$, $TaN_x$, $Zr_3N_4$, and $TiZr_xN_y$ in some embodiments. The diffusion barrier layers may be deposited from one pair of ALD precursors or from alternating pairs of ALD precursors used for forming, for example, a TiN film, TaN film, and a $Zr_3N_4$ film. In some embodiments, the films formed from alternating precursors may remain as intact layers. In other embodiments, the films formed from alternating precursors may be annealed to form an interdiffused diffusion barrier layer. In some embodiments, each of the layers 215, 220, 225, and 230 is a nanolayer of the same material (e.g., of $TiN_x$, TaN or $Zr_3N_4$) that together forms a single thicker diffusion barrier layer.

In some embodiments, a second set of layers 235 and 245 may together form an erosion resistant layer selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$, and $YZr_xAl_yO_z$. The erosion resistant layer may be deposited from one pair of ALD precursors or from alternating pairs of ALD precursors used for forming, for example, an $Al_2O_3$ film, $Y_2O_3$ film, $ZrO_2$ film, $YF_3$ film, and/or an $Er_2O_3$ film. In some embodiments, the films formed from alternating precursors may remain as intact layers. In other embodiments, the films formed from alternating precursors may be annealed to form an interdiffused erosion resistant layer. In some embodiments, each of the layers 235 and 245 is a nanolayer of the same material (e.g., of $Al_2O_3$, $Y_2O_3$, $ZrO_2$, $YF_3$, or $Er_2O_3$) that together forms a single thicker erosion resistant layer.

Figure 3:
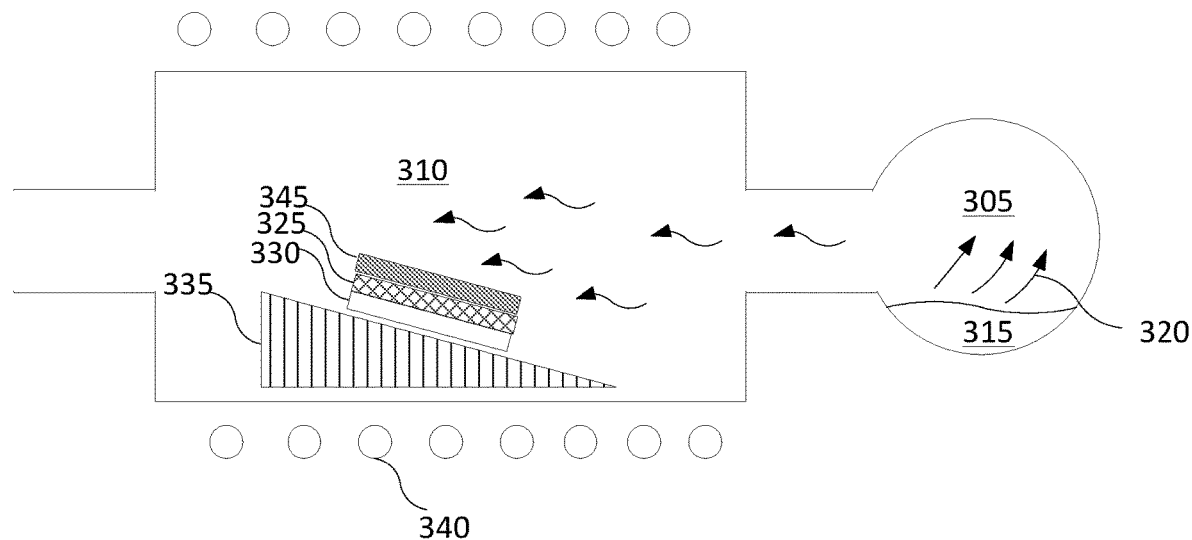
FIG. 3 depicts a deposition mechanism applicable to a variety of Chemical Vapor Deposition (CVD) techniques, in accordance with embodiments of the present invention.

In some embodiments, the multi-layer coating may be deposited on a surface of an article via CVD. An exemplary CVD system is illustrated in FIG. 3. The system comprises a chemical vapor precursor supply system 305 and a CVD reactor 310. The role of the vapor precursor supply system 305 is to generate vapor precursors 320 from a starting material 315, which could be in a solid, liquid, or gas form. The vapors are then transported into CVD reactor 310 and get deposited as thin film 325 on article 330 which is positioned on article holder 335.

CVD reactor 310 heats article 330 to a deposition temperature using heater 340. In some embodiments, the heater may heat the CVD reactor's wall (also known as "hot-wall reactor") and the reactor's wall may transfer heat to the article. In other embodiments, the article alone may be heated while maintaining the CVD reactor's wall cold (also known as "cold-wall reactor"). It is to be understood that the CVD system configuration should not be construed as limiting. A variety of equipment could be utilized for a CVD system and the equipment is chosen to obtain optimum processing conditions that may give a coating with uniform thickness, surface morphology, structure, and composition.

The various CVD processes comprise of the following process: (1) generate active gaseous reactant species (also known as "precursors") from the starting material; (2) transport the precursors into the reaction chamber (also referred to as "reactor"); (3) absorb the precursors onto the heated article; (4) participate in a chemical reaction between the precursor and the article at the gas-solid interface to form a deposit and a gaseous by-product; and (5) remove the gaseous by-product and unreacted gaseous precursors from the reaction chamber.

Suitable CVD precursors may be stable at room temperature, may have low vaporization temperature, can generate vapor that is stable at low temperature, have suitable deposition rate (low deposition rate for thin film coatings and high deposition rate for thick film coatings), relatively low toxicity, be cost effective, and relatively pure. For some CVD reactions, such as thermal decomposition reaction (also known as "pyrolysis") or a disproportionation reaction, a chemical precursor alone may suffice to complete the deposition. For other CVD reactions, other agents (listed in Table 1 below) in addition to a chemical precursor may be utilized to complete the deposition.

TABLE 1

Chemical Precursors and Additional Agents Utilized in Various CVD Reactions

| CVD reaction | Chemical Precursor | Additional Agents |
|---|---|---|
| Thermal Decomposition (Pyrolysis) | Halides Hydrides Metal carbonyl Metalorganic | N/A |
| Reduction | Halides | Reducing agent |
| Oxidation | Halides Hydrides Metalorganic | Oxidizing agent |
| Hydrolysis | Halides | Hydrolyzing agent |
| Nitridation | Halides Hydrides Halohydrides | Nitriding agent |
| Disproportionation | Halides | N/A |

CVD has many advantages including its capability to deposit highly dense and pure coatings and its ability to produce uniform films with good reproducibility and adhesion at reasonably high deposition rates. Layers deposited using CVD in embodiments may have a porosity of below 1%, and a porosity of below 0.1% (e.g., around 0%). Therefore, it can be used to uniformly coat complex shaped components and deposit conformal films with good conformal coverage (e.g., with substantially uniform thickness). CVD may also be utilized to deposit a film made of a plurality of components, for example, by feeding a plurality of chemical precursors at a predetermined ratio into a mixing chamber and then supplying the mixture to the CVD reactor system.

The CVD reactor 310 may be used to form a diffusion barrier layer and/or an erosion resistant layer that is resistant to erosion and/or corrosion by plasma environments in embodiments. Layer 325 may form a diffusion barrier layer selected from a group consisting of $TiN_x$, $TaN_x$, $Zr_3N_4$, and $TiZr_xN_y$ in embodiments. Layer 345 covering diffusion barrier layer 325 may be an erosion resistant layer selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$, and $YZr_xAl_yO_z$, in some embodiments.

In some embodiments, the multi-layer coating may be deposited on a surface of an article via PVD. PVD processes may be used to deposit thin films with thicknesses ranging from a few nanometers to several micrometers. The various PVD processes share three fundamental features in common: (1) evaporating the material from a solid source with the assistance of high temperature or gaseous plasma; (2) transporting the vaporized material in vacuum to the article's surface; and (3) condensing the vaporized material onto the article to generate a thin film layer. An illustrative PVD reactor is depicted in FIG. 4 and discussed in more detail below.

Figure 4:
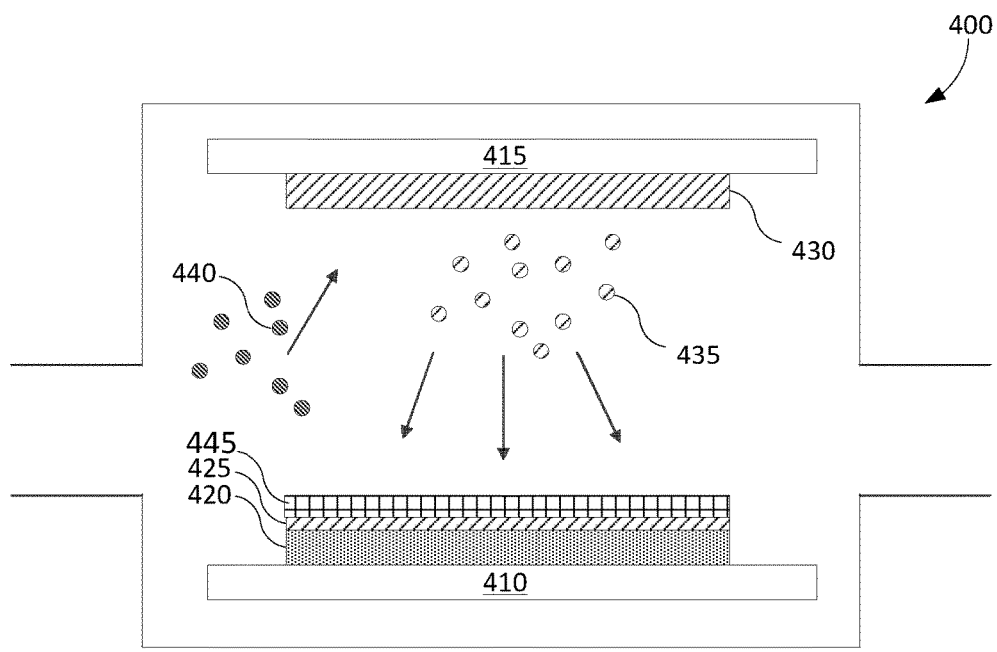
FIG. 4 depicts a deposition mechanism applicable to a variety of Physical Vapor Deposition (PVD) techniques, in accordance with embodiments of the present invention.

FIG. 4 depicts a deposition mechanism applicable to a variety of PVD techniques and reactors. PVD reactor chamber 400 may comprise a plate 410 adjacent to the article 420 and a plate 415 adjacent to the target 430. Air may be removed from reactor chamber 400, creating a vacuum. Then argon gas may be introduced into the reactor chamber, voltage may be applied to the plates, and a plasma comprising electrons and positive argon ions 440 may be generated. Positive argon ions 440 may be attracted to negative plate 415 where they may hit target 430 and release atoms 435 from the target. Released atoms 435 may get transported and deposited as a thin film 425 onto article 420.

The PVD reactor chamber 400 may be used to form a diffusion barrier layer and/or an erosion resistant layer in embodiments. Layer 425 may form a diffusion barrier layer selected from a group consisting of $TiN_x$, $TaN_x$, $Zr_3N_4$, and $TiZr_xN_y$, in embodiments. Layer 445 covering diffusion barrier layer 425 may be an erosion resistant layer selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$ and $YZr_xAl_yO_z$, in some embodiments.

Article 210 in FIG. 2, article 330 in FIG. 3, and article 420 in FIG. 4 may represent various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The articles and their surfaces may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

With the ALD, CVD, and PVD techniques, diffusion barrier films, such as $TiN_x$, $TaN_x$, $Zr_3N_4$, and $TiZr_xN_y$, and erosion resistant films, such as $YF_3$, $Y_2O_3$, $Er_2O_3$, $Al_2O_3$, $ZrO_2$, $ErAl_xO_y$, $YO_xF_y$, $YAl_xO_y$, $YZr_xO_y$ and $YZr_xAl_yO_z$ can be formed. In some embodiments, the diffusion barrier layer and the erosion resistant layer may both be deposited using the same technique, i.e. both may deposited via ALD, both may be deposited via CVD, or both may be deposited via PVD. In other embodiments, the diffusion barrier layer may be deposited by one technique and the erosion resistant layer may be deposited by another technique. If both layers are deposited via ALD, for example, the diffusion barrier layer may be adsorbed and deposited by proper sequencing of the precursors used to adsorb and deposit TiN, TaN, and $Zr_3N_4$, and the erosion resistant films may be adsorbed and deposited by proper sequencing of the precursors used to adsorb and deposit $Y_2O_3$, $Al_2O_3$, $YF_3$, $ZrO_2$, and $Er_2O_3$, as discussed in more detail below.

Figure 5:
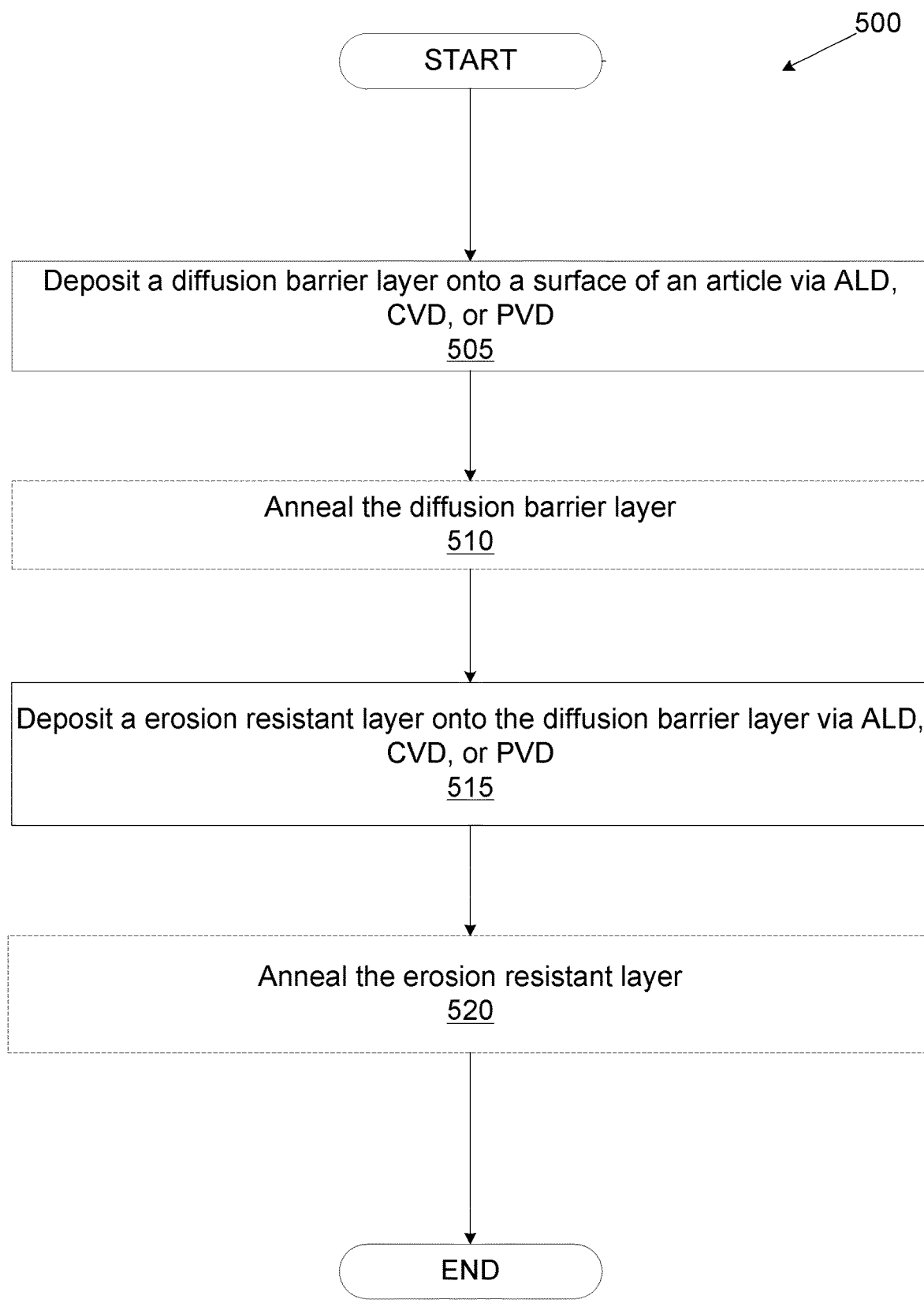
FIG. 5 illustrates a method for forming a multi-layer coating on an article according to an embodiment.

FIG. 5 illustrates a method 500 for forming a multi-layer coating on an article according to an embodiment. The method may optionally begin by selecting a composition for the multi-layer coating (not illustrated in FIG. 5). The composition selection and method of forming may be performed by the same entity or by multiple entities. Pursuant to block 505, the method comprises depositing a diffusion barrier layer onto a surface of an article using a first deposition process selected from a group consisting of ALD, CVD, and PVD. The diffusion barrier layer may comprise a plurality of intact layers. The plurality of intact layers may be made out of a plurality of precursors, forming a diffusion barrier layer. The diffusion barrier layer may have a thickness ranging from about 10 nm to about 100 nm and may be selected from a group consisting of $TiN_x$, $TaN_x$, $Zr_3N_4$, and $TiZr_xN_y$.

Pursuant to block 510, the method optionally further comprise annealing the diffusion barrier layer. In some embodiments, the annealing may result in a diffusion barrier layer comprising an interdiffused solid state phase of the plurality of components present in the plurality of intact layers. Annealing may be performed at a temperature ranging from about 800° C. to about 1800° C., from about 800° C. to about 1500° C., or from about 800° C. to about 1000° C. The annealing temperature may be selected based on the material of construction of the article, surface, and film layers so as to maintain their integrity and refrain from deforming, decomposing, or melting any or all of these components.

Pursuant to block 515, the method further comprises depositing an erosion resistant layer onto the diffusion barrier layer using a second deposition process selected from a group consisting of ALD, CVD, and PVD. The erosion resistant layer may comprise a plurality of intact layers. The plurality of intact layers may be made out of a plurality of precursors, forming an erosion resistant layer. The erosion resistant layer may have a thickness of up to about 1 micrometer, e.g. from about 20 nm to about 1 micrometer, and may be selected from a group consisting of $YF_3$, $Y_2O_3$, $Er_2O_3$, $Al_2O_3$, $ZrO_2$, $ErAl_xO_y$, $YO_xF_y$, $YAl_xO_y$, $YZr_xO_y$ and $YZr_xAl_yO_z$.

In some embodiments, the method may optionally further comprise annealing the erosion resistant layer, pursuant to block 520. In some embodiments, the annealing may result in an erosion resistant layer comprising an interdiffused solid state phase of the plurality of components present in the plurality of intact layers. The annealing temperature may be similar to the annealing temperature of the diffusion barrier layer listed above.

Figure 6A:
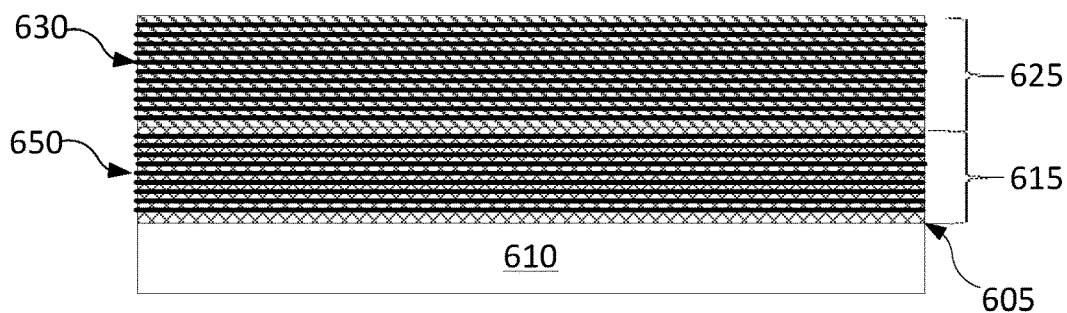
FIG. 6A illustrates a coated chamber component having a diffusion barrier layer with intact component layers and an erosion resistant layer with intact component layers, in accordance with embodiments of the present invention.
Figure 6B:
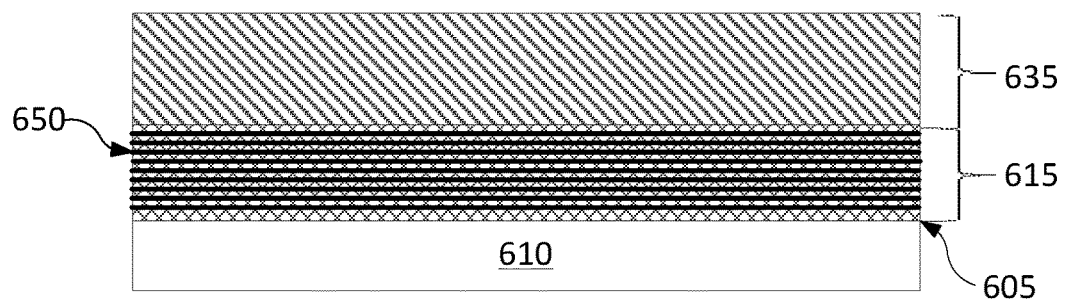
FIG. 6B illustrates a coated chamber component having a diffusion barrier layer with intact component layers and an interdiffused erosion resistant layer, in accordance with embodiments of the present invention.
Figure 6C:
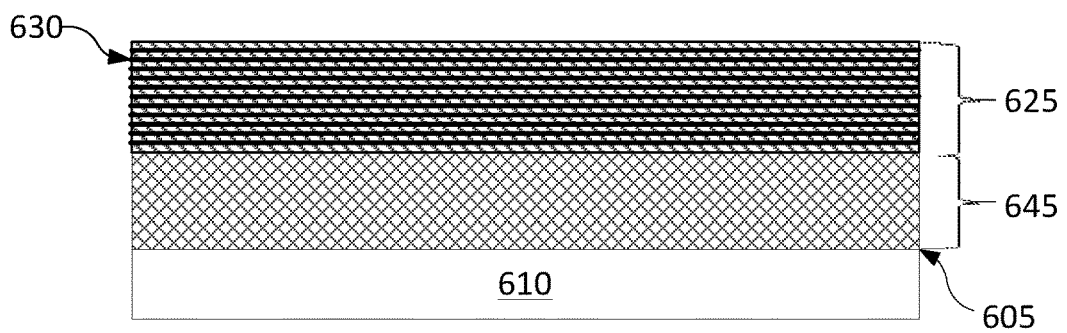
FIG. 6C illustrates a coated chamber component having an interdiffused diffusion barrier layer and an erosion resistant layer with intact component layers, in accordance with embodiments of the present invention.
Figure 6D:
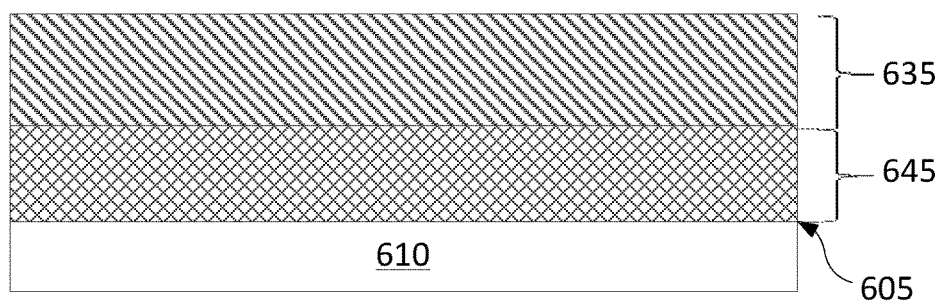
FIG. 6D illustrates a coated chamber component having an interdiffused diffusion barrier layer and an interdiffused erosion resistant layer, in accordance with embodiments of the present invention.

In some embodiments, the barrier layer and the erosion resistant layer may both be annealed and interdiffused (FIG. 6D). In some embodiments, a single annealing process is performed after deposition of the erosion resistant layer to anneal and interdiffuse nanolayers of the diffusion barrier layer and nanolayers of the erosion resistant layer. In some embodiments, one of the barrier layer and the erosion resistant layer are annealed and interdiffused, while the other layer is not annealed. (See FIG. 6B and FIG. 6C). In other embodiments, neither of the barrier layer or the erosion resistant layer is annealed or interdiffused (FIG. 6A). The various embodiments are illustrated in FIGS. 6A-6D and discussed in further detail below.

In some embodiments, the first deposition process of the diffusion barrier layer and the second deposition process of the erosion resistant layer may be identical, for example, both processes may be ALD, both process may be CVD, or both processes may be PVD. In other embodiments, the first deposition process of the diffusion barrier layer and the second deposition process of the erosion resistant layer may vary. Regardless of the deposition method, the final multi-layer coating may be able to withstand temperature cycling from about 20° C. to about 450° C. without cracking.

When the first or second deposition processes are ALD or CVD, a proper precursor or a plurality of precursors may be selected to ultimately form the diffusion barrier layer(s), erosion resistant layer(s), and multi-layer coating.

For instance, a $TiN_x$ diffusion barrier layer may be deposited via ALD or CVD from at least one Ti-containing precursor selected from the group consisting of bis(diethylamido)bis(dimethylamido)titanium(IV), tetrakis(diethylamido)titanium(IV), tetrakis(dimethylamido)titanium(IV), tetrakis(ethylmethylamido)titanium(IV), titanium(IV) bromide, titanium(IV) chloride, and titanium(IV) tert-butoxide.

A $TaN_x$ diffusion barrier layer may be deposited via ALD or CVD from at least one Ta precursor selected from the group consisting of pentakis(dimethylamido)tantalum(V), tantalum(V) chloride, tantalum(V) ethoxide, and tris(diethylamino)(tert-butylimido)tantalum(V).

A $TiZr_xN_y$ diffusion barrier layer may be deposited via ALD or CVD from at least one Ti precursor and from at least one Zr precursor. Ti precursors may be selected from the group consisting of bis(diethylamido)bis(dimethylamido)titanium(IV), tetrakis(diethylamido)titanium(IV), tetrakis(dimethylamido)titanium(IV), tetrakis(ethylmethylamido)titanium(IV), titanium(IV) bromide, titanium(IV) chloride, and titanium(IV) tert-butoxide. Zr precursors may be selected from the group consisting of zirconium (IV) bromide, zirconium (IV) chloride, zirconium (IV) tert-butoxide, tetrakis(diethylamido)zirconium (IV), tetrakis(dimethylamido)zirconium (IV), and tetrakis(ethylmethylamido)zirconium (IV). In some embodiments, the stoichiometric ratios of the various components may form a $Ti_{0.2}Zr_{0.2}N_{0.6}$ diffusion barrier layer.

A $Zr_3N_4$ diffusion barrier layer may be deposited via ALD or CVD from at least one Zr precursor selected from the group consisting of zirconium (IV) bromide, zirconium (IV) chloride, zirconium (IV) tert-butoxide, tetrakis(diethylamido)zirconium (IV), tetrakis(dimethylamido)zirconium (IV), and tetrakis(ethylmethylamido)zirconium (IV).

A $ErAl_xO_y$ erosion resistant layer may be deposited via ALD or CVD from at least one Er precursor and from at least one Al precursor. Er precursors may be selected from a group consisting of tris-methylcyclopentadienyl erbium (III) ($Er(MeCp)_3$), erbium boranamide ($Er(BA)_3$), $Er(TMHD)_3$, erbium(III) tris(2,2,6,6-tetramethyl-3,5-heptanedionate), and tris(butylcyclopentadienyl)erbium(III). Al precursors may be selected from the group consisting of diethylaluminum ethoxide, tris(ethylmethylamido)aluminum, aluminum sec-butoxide, aluminum tribromide, aluminum trichloride, triethylaluminum, triisobutylaluminum, trimethylaluminum, and tris(diethylamido)aluminum.

A $YAl_xO_y$ erosion resistant layer may be deposited via ALD or CVD from at least one Y precursor and from at least one Al precursor. Y precursors may be selected from the group consisting of tris(N,N-bis(trimethylsilyl)amide)yttrium (III), yttrium (III)butoxide, tris(cyclopentadienyl)yttrium(III), and Y(thd)3 (thd=2,2,6,6-tetramethyl-3,5-heptanedionato).

A $YO_xF_y$ erosion resistant layer may be deposited via ALD or CVD from at least one Y precursor selected from the group consisting of tris(N,N-bis(trimethylsilyl)amide)yttrium (III), yttrium (III)butoxide, tris(cyclopentadienyl)yttrium(III), and Y(thd)3 (thd=2,2,6,6-tetramethyl-3,5-heptanedionato).

A $YZr_xO_y$ erosion resistant layer may be deposited via ALD or CVD from at least one Y precursor and from at least one Zr precursor. Zr precursors may be selected from the group consisting of zirconium (IV) bromide, zirconium (IV) chloride, zirconium (IV) tert-butoxide, tetrakis(diethylamido)zirconium (IV), tetrakis(dimethylamido)zirconium (IV), and tetrakis(ethylmethylamido)zirconium (IV).

A $YZr_xAl_yO_z$ erosion resistant layer may be deposited via ALD or CVD from at least one Y precursor, from at least one Zr precursor and from at least one Al precursor.

An $Er_2O_3$ erosion resistant layer may be deposited via ALD or CVD from at least one Er precursor selected from a group consisting of tris-methylcyclopentadienyl erbium (III) ($Er(MeCp)_3$), erbium boranamide ($Er(BA)_3$), $Er(TMHD)_3$, erbium(III) tris(2,2,6,6-tetramethyl-3,5-heptanedionate), and tris(butylcyclopentadienyl)erbium(III).

An $Al_2O_3$ erosion resistant layer may be deposited via ALD or CVD from at least one Al precursor selected from the group consisting of diethylaluminum ethoxide, tris(ethylmethylamido)aluminum, aluminum sec-butoxide, aluminum tribromide, aluminum trichloride, triethylaluminum, triisobutylaluminum, trimethylaluminum, and tris(diethylamido)aluminum.

A $Y_2O_3$ erosion resistant layer may be deposited via ALD or CVD from at least one Y precursor selected from the group consisting of tris(N,N-bis(trimethylsilyl)amide)yttrium (III), yttrium (III)butoxide, tris(cyclopentadienyl)yttrium(III), and Y(thd)3 (thd=2,2,6,6-tetramethyl-3,5-heptanedionato).

A $YF_3$ erosion resistant layer may be deposited via ALD or CVD from at least one Y precursor.

A $ZrO_2$ erosion resistant layer may be deposited via ALD or CVD from at least one Zr precursor selected from the group consisting of zirconium (IV) bromide, zirconium (IV) chloride, zirconium (IV) tert-butoxide, tetrakis(diethylamido)zirconium (IV), tetrakis(dimethylamido)zirconium (IV), and tetrakis(ethylmethylamido)zirconium (IV).

In some embodiments, precursor gases providing an oxygen source, such as ozone, water vapor, and oxygen radicals from plasma may be used in conjunction with any of the precursors listed herein above. In some embodiments, precursor gases providing a nitrogen source, such as ammonia, nitrogen, and radicals from nitrogen plasma may be used in conjunction with any of the precursors listed herein above. In some embodiments, precursor gases providing a fluorine source, such as fluorine, HF, and fluorine radicals from a fluorine plasma may be used in conjunction with any of the precursors listed herein above. It is to be understood that the precursors listed herein above are merely illustrative and should not be construed as limiting.

FIGS. 6A-6D depict variations of a multi-layer coating according to different embodiments. FIG. 6A illustrates a multi-layer coating for an article 610 having a surface 605. For example, article 610 may include various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The semiconductor process chamber component may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

In FIGS. 6A-6D, the multi-layer coating deposited on surface 605 comprises a diffusion barrier layer 615 or 645 selected from a group consisting of $TiN_x$, $TaN_x$, $Zr_3N_4$, and TiZr$_x$N$_y$, and an erosion resistant layer 625 or 635 selected from a group consisting of YF$_3$, Y$_2$O$_3$, Er$_2$O$_3$, Al$_2$O$_3$, ZrO$_2$, ErAl$_x$O$_y$, YO$_x$F$_y$, YAl$_x$O$_y$, YZr$_x$O$_y$, and YZr$_x$Al$_y$O$_z$. The erosion resistant layer covers the diffusion barrier layer.

In FIG. 6A, both diffusion barrier layer 615 and erosion resistant layer 625 comprise a plurality of intact layers 650 and 630, respectively. In FIG. 6B, diffusion barrier layer 615 comprises a plurality of intact layers 650, whereas erosion resistant layer 635 may be in an interdiffused solid state phase of the plurality of components composing the erosion resistant layer. In FIG. 6C, diffusion barrier layer 645 may be in an interdiffused solid state phase of the plurality of components composing the diffusion barrier layer, whereas erosion resistant layer 625 may comprise a plurality of intact layers. In FIG. 6D, both diffusion barrier layer 645 and erosion resistant layer 635 may be in an inter-diffused solid state phase of the plurality of components composing each of the layers. Alternatively, the components of the diffusion barrier layer 645 may interdiffuse to form multiple different phases and/or the components of the erosion resistant layer 635 may interdiffuse to form multiple different phases.

Although the diffusion barrier layer and the erosion resistant layer illustrated in FIGS. 6A-6D may seem as having a similar thickness, these figures should not be construed as limiting. In some embodiments, the diffusion barrier layer may have a lesser thickness than the erosion resistant layer. In some embodiments, the diffusion barrier layer may have a greater thickness than the erosion resistant layer. In some embodiments, the thickness of the diffusion barrier layer and of the erosion resistant layer may be the same. The diffusion barrier layer may have a thickness ranging from about 10 nm to about 100 nm. The erosion resistant layer may have a thickness of up to about 1 micrometer, e.g., from about 20 nm to about 1 micrometer.

The surface roughness of the multi-layer coating may be similar to the roughness of the semiconductor process chamber component. In some embodiments, the surface roughness of the multi-layer coating may range from about 20 to about 45 microinches.

An aluminum oxide erosion resistant layer deposited by ALD may have the following properties: a breakdown voltage of about 360 volts at a thickness of about 1 micrometer, a scratch adhesion failure force based on a 10 micron diamond stylus scratch adhesion test of about 140 mN at a thickness of about 1 micrometer, a Vickers hardness of about 12.9-13.5 GPa, and a time to failure of about 1-28 hours for a one micron thick film based on a bubble test. A yttrium oxide erosion resistant layer deposited by ALD may have the following properties: a breakdown voltage of about 475 volts at a thickness of about 1 micrometer, a scratch adhesion failure force based on a 10 micrometer diamond stylus scratch adhesion test of 34 mN at a thickness of about 100 nm, a Vickers hardness of about 11.5 GPa to about 12.9 GPa, and about 14 minutes time to failure for a one micrometer film based on a bubble test.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

When the term "porosity" is used herein, it is intended to describe the amount of empty space within the coating. For example, a 5% porosity would mean that 5% of the total volume of the coating is actually empty space.

When the term "surface roughness" is used herein, it described a measure of the roughness of a surface using a profilometer (a needle dragged across the surface).

When the term "break down voltage" or "BDV" is used herein, it refers to evaluation of the coating using voltage. The BDV value is the voltage reached when the coating destructively arcs.

When the term "adhesion" is used herein, it refers to the strength of the coating to adhere to an underlying article or underlying coating.

When the term "hardness" is used herein, it refers to the amount of compression that a film can withstand without damage.

When the term "bubble test" is used herein, it refers to a test in which the coated article is placed in hydrochloric acid solution, and the time until the formation of a bubble on the liquid is measured. The formation of the bubble indicates that the article itself has reacted and the coating has been penetrated.

The ability to withstand the temperature cycling means that the multi-layer coating can be processed through temperature cycles without experiencing cracking.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A coated article comprising an article and a multi-layer coating deposited on a surface of the article, the multi-layer coating comprising:
    a diffusion barrier layer selected from a group consisting of TiN$_x$, TaN$_x$, Zr$_3$N$_4$, and TiZr$_x$N$_y$, wherein the diffusion barrier layer seals the article from diffusion of metal contaminants therethrough; and
    an erosion resistant layer comprising YZr$_x$O$_y$, wherein the erosion resistant layer contacts and covers the diffusion barrier layer.

2. The coated article of claim 1, wherein the diffusion barrier layer has a thickness ranging from about 10 nm to about 100 nm, and wherein the erosion resistant layer has a thickness of up to about 1 micrometer.

3. The coated article of claim 1, wherein the multi-layer coating is able to withstand temperature cycling from about 20° C. to about 450° C. without cracking.

4. The coated article of claim 1, wherein the diffusion barrier layer is conformal to the surface of the article.

5. The coated article of claim 1, wherein the diffusion barrier layer has a porosity of less than 1%.

6. The coated article of claim 1, wherein the diffusion barrier layer has a porosity of less than 0.1%.

7. The coated article of claim 1, wherein the erosion resistant layer is conformal to the diffusion barrier layer.

8. The coated article of claim 1, wherein the erosion resistant layer has a porosity of less than 1%.

9. The coated article of claim 1, wherein the erosion resistant layer has a porosity of less than 0.1%.

10. A coated process chamber component comprising:
a process chamber component having a surface; and
a multi-layer coating on the surface, comprising:
a diffusion barrier layer selected from a group consisting of $TiN_x$, $TaN_x$, $Zr_3N_4$, and $TiZr_xN_y$, wherein the diffusion barrier layer seals the surface from diffusion of metal contaminants there through; and
an erosion resistant layer comprising $YZr_xO_y$, wherein the erosion resistant layer contacts and covers the diffusion barrier layer.

11. The coated process chamber component of claim 10, wherein the diffusion barrier layer has a thickness ranging from about 10 nm to about 100 nm, and wherein the erosion resistant layer has a thickness of up to about 1 micrometer.

12. The coated process chamber component of claim 10, wherein the diffusion barrier layer is conformal to the surface of the process chamber component.

13. The coated process chamber component of claim 10, wherein the diffusion barrier layer has a porosity of less than 1%.

14. The coated process chamber component of claim 10, wherein the diffusion barrier layer has a porosity of less than 0.1%.

15. The coated process chamber component of claim 10, wherein the erosion resistant layer is conformal to the diffusion barrier layer.

16. The coated process chamber component of claim 10, wherein the erosion resistant layer has a porosity of less than 1%.

17. The coated process chamber component of claim 10, wherein the erosion resistant layer has a porosity of less than 0.1%.

* * * * *